US011398367B2

(12) United States Patent
Miwa et al.

(10) Patent No.: US 11,398,367 B2
(45) Date of Patent: Jul. 26, 2022

(54) CHARGED PARTICLE BEAM APPARATUS

(71) Applicant: Hitachi High-Tech Corporation, Tokyo (JP)

(72) Inventors: Takafumi Miwa, Tokyo (JP); Yohei Nakamura, Tokyo (JP); Natsuki Tsuno, Tokyo (JP); Heita Kimizuka, Tokyo (JP); Muneyuki Fukuda, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 16/928,931

(22) Filed: Jul. 14, 2020

(65) Prior Publication Data

US 2021/0043413 A1 Feb. 11, 2021

(30) Foreign Application Priority Data

Aug. 8, 2019 (JP) .............................. JP2019-146175

(51) Int. Cl.
*H01J 37/24* (2006.01)
*H01J 37/244* (2006.01)
*H01J 37/28* (2006.01)

(52) U.S. Cl.
CPC ............ *H01J 37/24* (2013.01); *H01J 37/244* (2013.01); *H01J 37/28* (2013.01);
(Continued)

(58) Field of Classification Search
CPC .. H01J 37/22; H01J 37/244; H01J 2237/2482; H01J 2237/2448; H01J 43/00;
(Continued)

(56) References Cited

U.S. PATENT DOCUMENTS 7,026,615 B2 4/2006 Takane et al.
7,114,136 B2 9/2006 Chase et al.
(Continued)

FOREIGN PATENT DOCUMENTS

EP 1267392 B1 7/2013
JP H05275045 10/1993
(Continued)

OTHER PUBLICATIONS

Non Final Office Action dated Jun. 1, 2021 in U.S. Appl. No. 16/927,932.
(Continued)

*Primary Examiner* — David A Vanore
(74) *Attorney, Agent, or Firm* — Miles & Stockbridge, P.C.

(57) ABSTRACT

A charged particle beam apparatus includes a database that stores a to-be-used-in-calculation device model for use in estimation of a circuit of a sample and an optical condition under which a charged particle beam is applied to the sample, a charged particle beam optical system that controls the beam applied to the sample under the optical condition, a detector that detects secondary electrons emitted from the sample excited by the application of the beam and outputs a detection signal based on the secondary electrons, and a computing unit that generates a to-be-used-in-computation netlist based on the to-be-used-in-calculation device model, estimates a first application result when the beam is applied to the sample based on the to-be-used-in-computation netlist and the optical condition, and compares the first application result with a second application result when the beam is applied to the sample based on the optical condition.

11 Claims, 8 Drawing Sheets

(52) U.S. Cl.
CPC ............... *H01J 2237/221* (2013.01); *H01J 2237/24475* (2013.01); *H01J 2237/2817* (2013.01)

(58) Field of Classification Search
CPC ......... G01N 23/2251; G01N 2223/646; G01N 2223/07; G01N 2223/507
See application file for complete search history.

(56) References Cited

U.S. PATENT DOCUMENTS

| | | | |
|---|---|---|---|
| 7,235,782 B2 | 6/2007 | Takane et al. | |
| 8,725,667 B2 | 5/2014 | Kaushal et al. | |
| 9,111,717 B2 | 8/2015 | Asahata et al. | |
| 9,536,038 B1 | 1/2017 | Quinton et al. | |
| 9,916,965 B2 | 3/2018 | Bhaskar et al. | |
| 9,946,165 B2 | 4/2018 | Ypma et al. | |
| 9,966,225 B2 | 5/2018 | Bizen et al. | |
| 10,026,589 B1 | 7/2018 | Monahan et al. | |
| 10,180,402 B2 | 1/2019 | Stoker et al. | |
| 10,274,834 B2 | 4/2019 | Ypma et al. | |
| 10,642,162 B2 | 5/2020 | Ypma et al. | |
| 10,714,304 B2* | 7/2020 | Fukuda | H01J 37/21 |
| 10,818,001 B2 | 10/2020 | Leung et al. | |
| 10,872,742 B2* | 12/2020 | Miwa | H01J 37/09 |
| 10,879,037 B2* | 12/2020 | Tsuno | H01J 37/265 |
| 10,971,330 B2 | 4/2021 | Torikawa | |
| 10,971,347 B2* | 4/2021 | Nakamura | H01J 37/28 |
| 11,011,348 B2* | 5/2021 | Bizen | H01J 37/05 |
| 2003/0057971 A1 | 3/2003 | Nishiyama et al. | |
| 2008/0077376 A1 | 3/2008 | Belhaddad et al. | |
| 2010/0115478 A1 | 5/2010 | Pedenon et al. | |
| 2012/0126116 A1 | 5/2012 | Tanaka et al. | |
| 2013/0200255 A1 | 8/2013 | Schwarzband et al. | |
| 2020/0264520 A1 | 8/2020 | Ypma et al. | |
| 2021/0043412 A1 | 2/2021 | Miwa et al. | |
| 2021/0066028 A1 | 3/2021 | Shirasaki et al. | |

FOREIGN PATENT DOCUMENTS

| | | |
|---|---|---|
| JP | 2002328015 A | 11/2002 |
| JP | 2003100823 A | 4/2003 |
| JP | 2003151483 A | 5/2003 |
| JP | 2008130582 A | 6/2008 |
| JP | 2010129516 A | 6/2010 |
| JP | 2010205864 A | 9/2010 |
| JP | 2011033423 A | 2/2011 |
| JP | 2011186044 A | 9/2011 |
| JP | 2012178236 A | 9/2012 |
| JP | 2013161795 A | 8/2013 |
| JP | 2013178143 A | 9/2013 |
| JP | 6272487 B2 | 1/2018 |
| TW | 201104452 A | 2/2011 |
| TW | 201516598 A | 5/2015 |
| TW | 201734439 A | 10/2017 |
| WO | 0171782 A1 | 9/2001 |

OTHER PUBLICATIONS

Non Final Office Action dated Jun. 4, 2021 in U.S. Appl. No. 16/927,925.
Office Action dated Jun. 22, 2021 in Taiwanese Application No. 109122980.
Office Action dated Jul. 14, 2021 in Taiwanese Application No. 109122986.
Office Action dated Jul. 14, 2021 in Taiwanese Application No. 109123139.
Office Action dated Feb. 19, 2022 in Korean Application No. 10-2020-0075539.

\* cited by examiner

FIG. 3

TO-BE-USED-IN-CALCULATION DEVICE MODEL 42

| ID 42a | MODEL 42b | MATHEMATICAL EXPRESSION 42c | PARAMETER TYPE 42d | PARAMETER VALUE 42e | ... 42f |
|---|---|---|---|---|---|
| DM1 | RC PARALLEL | A+Bexp(-t/RC) | RESISTANCE R | $\alpha$ | ... |
| | | | CAPACITANCE C | $\beta$ | ... |
| ... | ... | ... | ... | ... | ... |

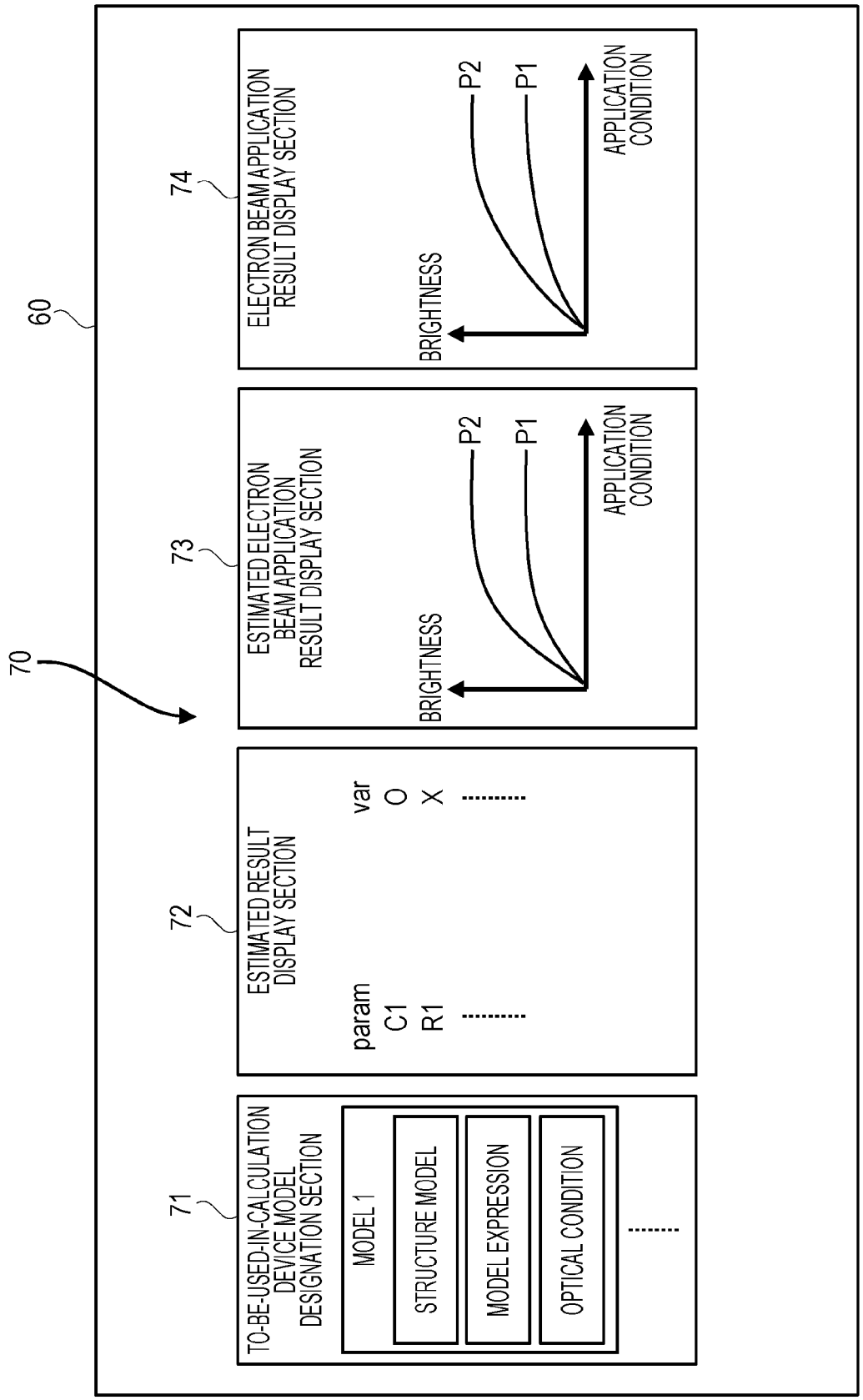

```
R9 N013 N011 1k
X1 N001 N011 N021 NMOS
```

```
N001=P1
N002=P2
```

CHARGED PARTICLE BEAM APPARATUS

BACKGROUND OF THE INVENTION

1. Field of the Invention

The present invention relates to a charged particle beam apparatus.

2. Description of the Related Art

Charged particle beam apparatuses such as electron microscopes and ion microscopes are used in observation of various samples having a fine structure. For example, for the purpose of process control on a manufacturing process of semiconductor devices, a scanning electron microscope that is one of the charged particle beam apparatuses is used in measurement of dimensions of a semiconductor device pattern formed on a semiconductor wafer serving as a sample, defect inspection of the semiconductor device pattern, or the like.

A method known as one of the sample analysis methods using an electron microscope is to form a potential contrast image from secondary electrons obtained through application of an electron beam to a sample and evaluate electrical resistance of an element formed on the sample on the basis of analysis of the potential contrast image.

For example, JP 2003-100823 A discloses a method for identifying a defect by calculating an electrical resistance value from a potential contrast. JP 2008-130582 A discloses a method for predicting characteristics of a defect in an electric resistance value or the like by creating, as an equivalent circuit, a netlist that describes information on electrical characteristics and connectivity of circuit elements from a potential contrast.

SUMMARY OF THE INVENTION

For inspection and measurement of semiconductor devices, it is required that a defect in electrical characteristics of the devices in a manufacturing process be detected. However, with the techniques disclosed in JP 2003-100823 A and JP 2008-130582 A, it is difficult to estimate the electrical characteristics with consideration given to interactions between a plurality of the devices using design data and inspection measurement data. In addition, it takes a lot of time and effort to convert the design data, and it takes a long time to estimate the electrical characteristics.

Therefore, an object of the present invention is to provide a charged particle beam apparatus that estimates, in a short time, electrical characteristics with consideration given to interactions between a plurality of devices.

The following is a brief description of the summary of a primary aspect of the invention disclosed herein.

A charged particle beam apparatus according to the primary aspect of the present invention includes a database configured to store a to-be-used-in-calculation device model for use in estimation of a circuit of a sample and an optical condition under which a charged particle beam is applied to the sample, a charged particle beam optical system configured to control the charged particle beam applied to the sample under the optical condition, a detector configured to detect secondary electrons emitted from the sample excited by the application of the charged particle beam and output a detection signal based on the secondary electrons, and a computing unit configured to generate a to-be-used-in-computation netlist on the basis of the to-be-used-in-calculation device model, estimate a first application result when the charged particle beam is applied to the sample on the basis of the to-be-used-in-computation netlist and the optical condition, and compare the first application result with a second application result when the charged particle beam is applied to the sample on the basis of the optical condition.

The following is a brief description of an effect obtained by the primary aspect of the invention disclosed herein.

That is, according to the primary aspect of the present invention, it is possible to estimate, in a short time, electrical characteristics with consideration given to interactions between a plurality of devices.

BRIEF DESCRIPTION OF THE DRAWINGS

FIG. 3 is a diagram showing a to-be-used-in-calculation device model stored in a database;

FIG. 8 is a diagram showing an example of a result display screen after circuit estimation.

DESCRIPTION OF THE PREFERRED EMBODIMENTS

Figure 1:
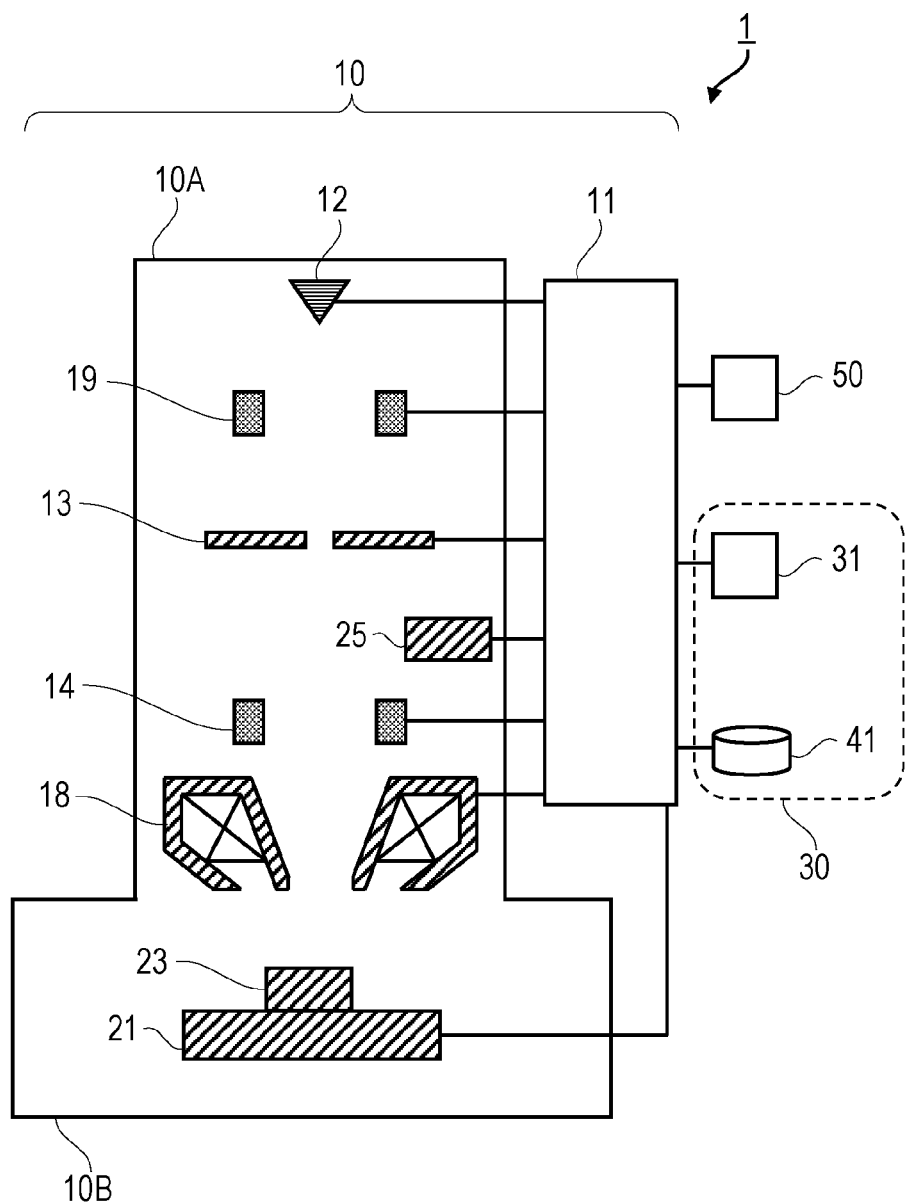
FIG. 1 is a schematic diagram showing an example of a structure of a charged particle beam apparatus according to a first embodiment of the present invention.

Preferred embodiments of the present invention will be described below with reference to the accompanying drawings. Each of the embodiments described below is an example for practicing the present invention and is not intended to limit the technical scope of the present invention. Note that, in the embodiments, components having the same function are denoted by the same reference numerals, and repeated description of such components will be omitted unless particularly necessary.

First Embodiment

<Structure of Charged Particle Beam Apparatus>

Figure 2:
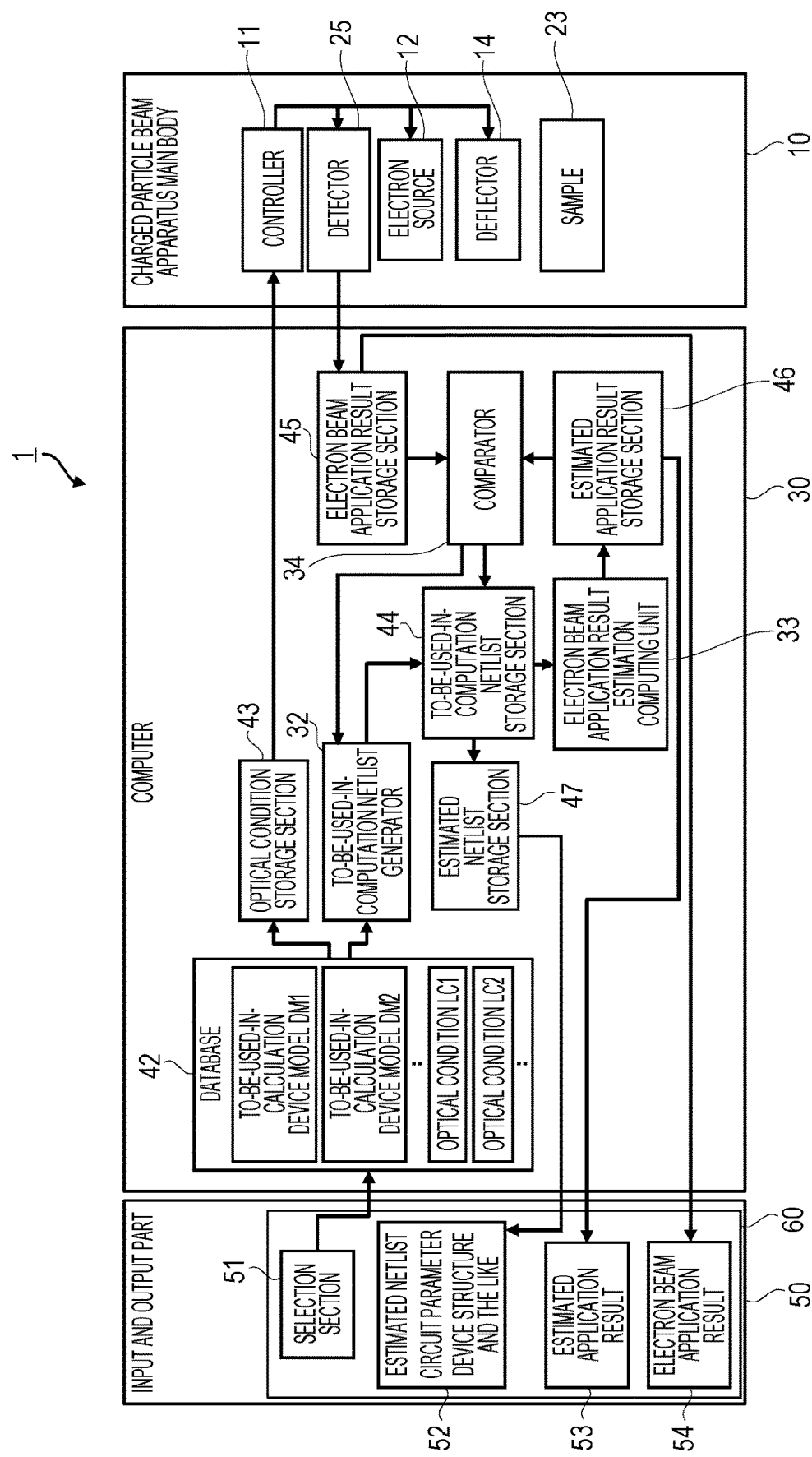
FIG. 2 is a block diagram showing an example of the structure of the charged particle beam apparatus according to the first embodiment of the present invention.

FIG. 1 is a schematic diagram showing an example of a structure of a charged particle beam apparatus according to a first embodiment of the present invention. FIG. 2 is a block diagram showing an example of the structure of the charged particle beam apparatus according to the first embodiment of the present invention. As shown in FIGS. 1 and 2, a charged particle beam apparatus 1 includes a charged particle beam apparatus main body 10, a computer 30, and an input and output part 50.

<Charged Particle Beam Apparatus Main Body>

The charged particle beam apparatus main body 10 has a structure where a lens barrel 10A is mounted on a sample chamber 10B in which a sample 23 to be inspected is held, and a controller 11 is disposed outside the lens barrel 10A and the sample chamber 10B. In the lens barrel 10A, an electron source (charged particle source) 12 that emits an electron beam (charged particle beam), a pulsed electron generator 19 that pulses the electron beam, a diaphragm 13 that regulates an application current of the electron beam thus emitted, a deflector 14 that controls an application direction of the electron beam, an objective lens 18 that causes the electron beam to converge, and the like are held. Although not shown, in the lens barrel 10A, a condenser lens is provided. Note that, unless the electron beam is pulsed, the pulsed electron generator 19 need not be provided.

Further, in the lens barrel 10A, a detector 25 that detects secondary electrons emitted from the sample 23 excited by the application of the electron beam, and outputs a detection signal based on the secondary electrons. The detection signal is used in generation of a scanning electron microscopy (SEM) image, measurement of the size of the sample 23, measurement of electrical characteristics, and the like.

In the sample chamber 10B, a stage 21, the sample 23, and the like are held. The sample 23 is mounted on the stage 21. Examples of the sample 23 include a semiconductor wafer including a plurality of semiconductor devices, and an individual semiconductor device. The stage 21 is provided with a stage drive mechanism (not shown) and is movable within the sample chamber 10B under the control of the controller 11.

The controller 11 is a functional block responsible for controlling components of the charged particle beam apparatus main body 10. The controller 11 controls the operation of each component such as the electron source 12, the pulsed electron generator 19, the diaphragm 13, the deflector 14, and the objective lens 18 under, for example, an optical condition input from the computer 30 and the like. As described above, the controller 11, the electron source 12, the pulsed electron generator 19, the diaphragm 13, the deflector 14, the objective lens 18, and the like constitute a charged particle beam optical system BS that controls the electron beam.

Further, the controller 11 moves the sample 23 to a predetermined position by controlling the stage drive mechanism under, for example, the optical condition input from the computer 30 and the like. Further, the controller 11 controls a power supply or control signal supply to the detector 25 to control a process of detecting the secondary electrons performed by the detector 25.

The controller 11 is implemented with a program executed by a processor such as a CPU. Further, the controller 11 may be configured by, for example, a field-programmable gate array (FPGA) or an application specific integrated circuit (ASIC).

<Computer>

As shown in FIG. 1, the computer 30 includes a computing unit 31 and a storage device 41. The computing unit 31 is a functional block responsible for estimating a circuit (or equivalent circuit) of the sample 23. As shown in FIG. 2, for example, the computing unit 31 includes a to-be-used-in-computation netlist generator 32, an electron beam application result estimation computing unit 33, and a comparator 34. The to-be-used-in-computation netlist generator 32 generates a to-be-used-in-computation netlist corresponding to the sample 23 on the basis of a to-be-used-in-calculation device model to be described later and the optical condition. Further, the to-be-used-in-computation netlist generator 32 also updates the to-be-used-in-computation netlist on the basis of a comparison result from the comparator 34.

The electron beam application result estimation computing unit 33 estimates an electron beam application result on the basis of the to-be-used-in-computation netlist generated by the to-be-used-in-computation netlist generator 32. The comparator 34 compares the electron beam application result estimated by the electron beam application result estimation computing unit 33 (first application result) with an actually measured electron beam application result (second application result).

In addition to these processes, the computing unit 31 performs a process of displaying the estimated electron beam application result, the measured electron beam application result, and a netlist identified for the sample 23 (hereinafter, also referred to as "estimated netlist"), a process of generating an inspection image (SEM image or the like) of the sample 23 on the basis of the detection signal, measuring the size of the sample 23, and measuring the electrical characteristics of the sample 23, and the like.

The computing unit 31 may be implemented with a program executed by a processor such as a CPU, as in the controller 11, or alternatively, may be configured by an FPGA, an ASIC, or the like.

The storage device 41 includes a database 42, an optical condition storage section 43, a to-be-used-in-computation netlist storage section 44, an electron beam application result storage section 45, and an estimated application result storage section 46. The database 42 stores to-be-used-in-calculation device models (for example, DM1 and DM2) and optical conditions (for example, LC1 and LC2) used in generation of the to-be-used-in-computation netlist. Note that the to-be-used-in-calculation device models include a model representing a defect in a device including the sample.

A user may operate the input and output part 50 to register the to-be-used-in-calculation device models and the optical conditions, or alternatively, the computer 30 may be connected to an external device to receive the to-be-used-in-calculation device models from the external device. The database 42 stores the to-be-used-in-calculation device models and the optical conditions, for example, in the form of a look up table (LUT).

FIG. 3 is a diagram showing an example of the to-be-used-in-calculation device model stored in the database. A unique ID 42a (for example, DM1 and DM2) is assigned to each of to-be-used-in-calculation device models, and each of the to-be-used-in-calculation device models is identified by the ID 42a. Each of the to-be-used-in-calculation device models includes pieces of information such as a model 42b, a mathematical expression 42c, a parameter type 42d, a parameter value 42e, and other data 42f. Note that, in each of the to-be-used-in-calculation device models, only some of the pieces of information may be defined.

The model 42b is information that defines a circuit of the device. Information defining a circuit such as an RC parallel circuit is registered as the model 42b. Alternatively, a waveform model of the device or the like may be registered as the model 42b. The mathematical expression 42c includes information that defines electrical characteristics of the device that cannot be expressed by the circuit. The parameter type 42d is information that defines a type of circuit element included in the device, such as resistance (R) or capacitance (C). The parameter value 42e is associated with each element of the parameter type 42d and is information that defines a value of the circuit element associated with the parameter type 42d. For example, when the resistance (R) and the capacitance (C) are registered as the parameter types, their respective parameter values are a resistance value and a capacitance value. The other data 42f includes information such as a shape of the device or physical properties of the device.

Figure 4:
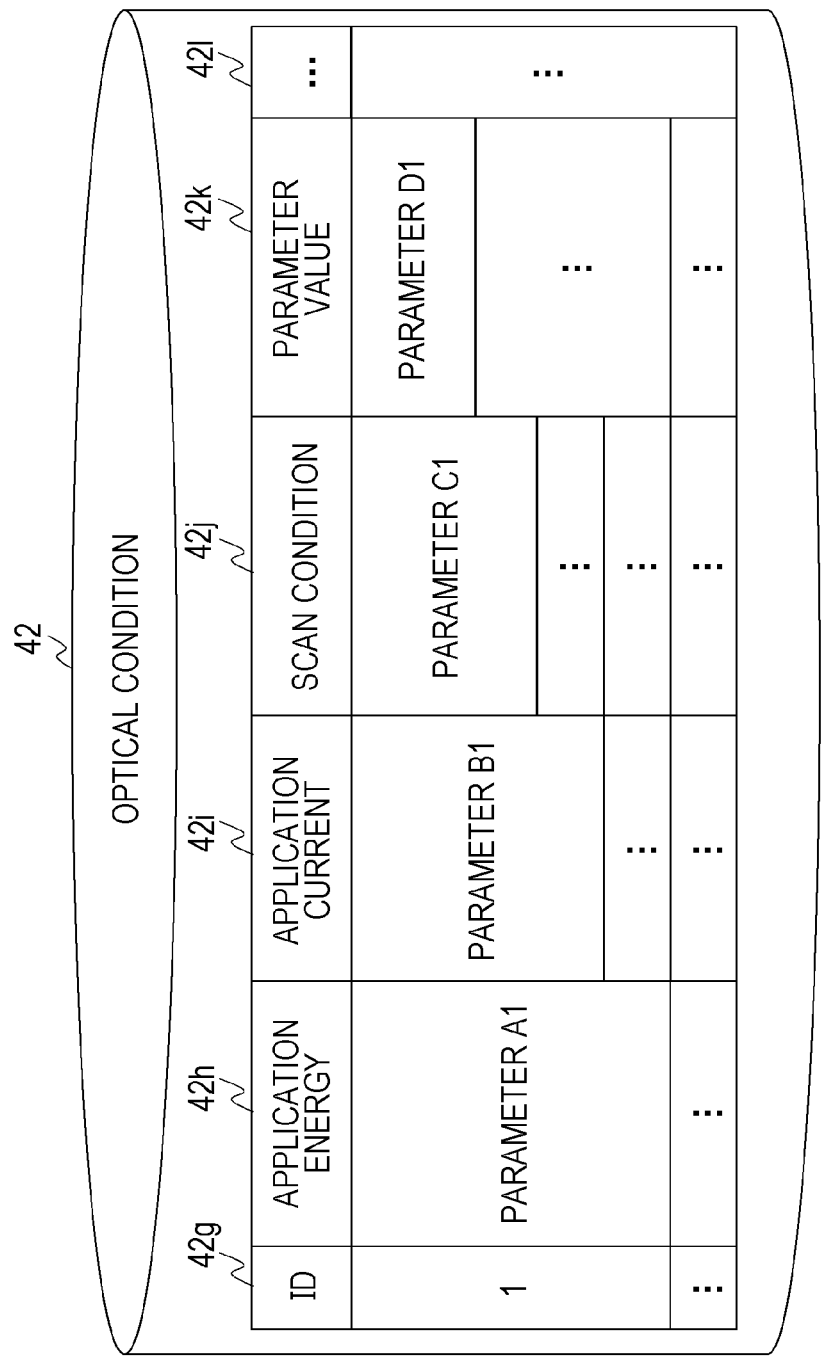
FIG. 4 is a diagram showing an optical condition stored in a database.

FIG. 4 is a diagram showing the optical condition stored in the database. A unique ID 42*g* (for example, LC1 and LC2) is assigned to each of the optical conditions, and each of the optical conditions is identified by the ID 42*g*. Each of the optical conditions includes pieces of information such as application energy 42*h*, an application current 42*i*, a scan condition 42*j*, a parameter value 42*k*, and other data 42*l*. Note that, in each of the optical conditions, only some of the pieces of information may be defined.

The application energy 42*h* is information that defines energy of the charged electron beam applied to the sample. The application energy includes, for example, an electron accelerating voltage or retarding voltage. Herein, the retarding voltage refers to a voltage that decelerates the electron beam (charged particle beam) immediately before the sample by applying the voltage to the sample. The application current 42*i* is information that defines the current of the electron beam. The application current may also be referred to as a probe current.

The scan condition 42*j* is information that defines an electron beam application method. The scan condition 42*j* includes, for example, pieces of information such as a scan speed (scanning speed) and a scanning interval. The parameter value 42*k* is information that defines a parameter associated with the application of the electron beam. The parameter value 42*k* includes, for example, pieces of information such as a magnification, an aperture angle, and a working distance. The other data 42*l* includes the other pieces of information associated with a corresponding optical condition. Further, the other data 42*l* may include an electron beam pulse conversion condition (modulation condition).

The electron beam pulse conversion condition includes, for example, a pulse width, a duty cycle, a frequency, any pattern in which the pulse width and the duty cycle change with time, and the like.

Note that the optical condition may be referred to as an electron optical condition, for example.

The optical condition storage section 43 stores a selected electron beam optical condition. The to-be-used-in-computation netlist storage section 44 stores the to-be-used-in-computation netlist generated or updated by the to-be-used-in-computation netlist generator 32. The electron beam application result storage section 45 stores the electron beam application result of the sample 23 actually measured on the basis of the detection signal output from the detector 25. The electron beam application result stored in the electron beam application result storage section 45 may be the detection signal output from the detector 25, the SEM image based on the detection signal, or the like. The estimated application result storage section 46 stores the electron beam application result of the sample 23 estimated by the electron beam application result estimation computing unit 33.

The storage device 41 is configured by, for example, a non-volatile memory such as a flash memory. Further, some of the storage sections included in the storage device 41 may be configured by a volatile memory such as a dynamic random access memory (DRAM) or a static random access memory (SRAM). Each of the storage sections included in the storage device 41 may be provided as a separate device, or alternatively, as a separate storage area defined in one storage device.

<Input and Output Part>

The input and output part 50 is a functional block responsible for operations on the charged particle beam apparatus 1, selection of the to-be-used-in-calculation device model or optical condition, display of the electron beam application result and estimated application result of the sample 23, and the estimated netlist, and the like. The input and output part 50 includes a display 60 of, for example, a touch screen type. On the display 60, for example, an operation panel of the charged particle beam apparatus 1, a selection section 51 for use in selection of the to-be-used-in-calculation device model or optical condition, an estimated netlist 52, an estimated application result 53, an electron beam application result 54, and the like are displayed.

<Circuit Estimation Method for Sample>

Figure 5:
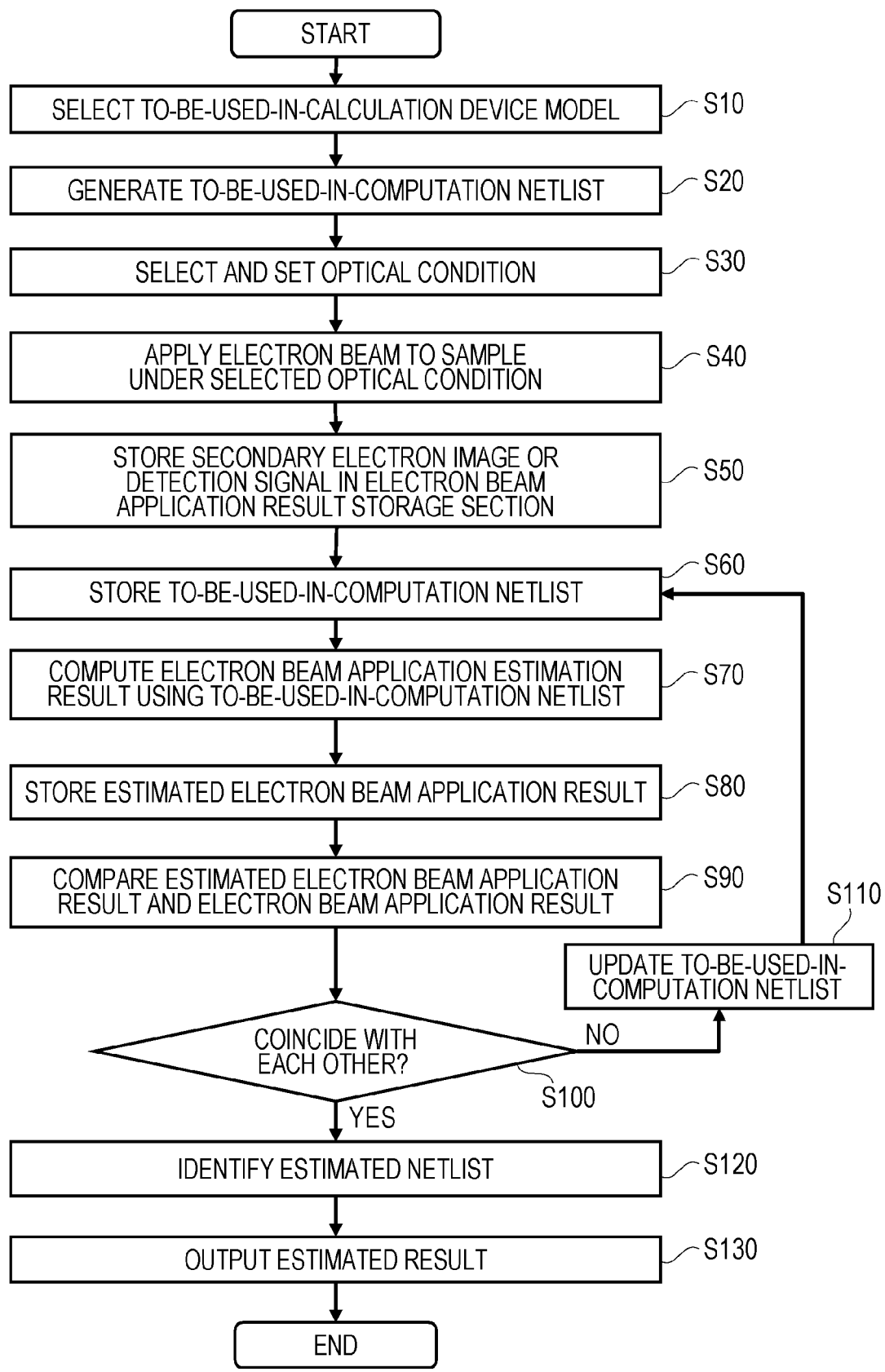
FIG. 5 is a flowchart showing an example of a circuit estimation method for a sample.

Next, a circuit estimation method for the sample 23 will be described. According to the present embodiment, a netlist of the sample is estimated on the basis of the to-be-used-in-computation netlist generated from the to-be-used-in-calculation device model and a comparison between the electron beam application result estimated using the optical condition and the actual electron beam application result based on the optical condition. FIG. 5 is a flowchart showing an example of the circuit estimation method for the sample. In the example shown in FIG. 5, the circuit estimation for the sample is made in steps S10 to S130.

Figure 6:
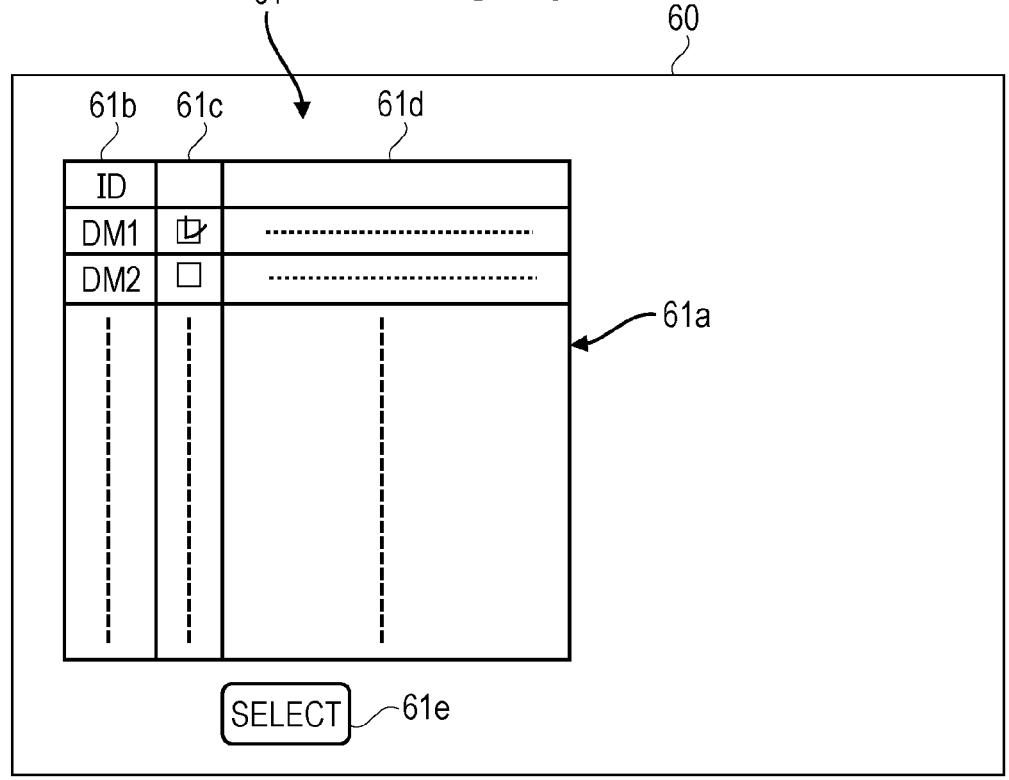
FIG. 6 is a diagram showing an example of a to-be-used-in-calculation device model selection screen.

Once the circuit estimation process is initiated, the to-be-used-in-calculation device model is selected (step S10). FIG. 6 is a diagram showing an example of a to-be-used-in-calculation device model selection screen. On the to-be-used-in-calculation device model selection screen 61 shown in FIG. 6, for example, a list 61*a* of the to-be-used-in-calculation device models registered in the database 42 and a selection determination button 61*e* are shown. The list 61*a* includes an ID display field 61*b* of each of the registered to-be-used-in-calculation device model, a to-be-used-in-calculation device model selection field 61*c*, and a details display field 61*d* of a corresponding to-be-used-in-calculation device model.

From the to-be-used-in-calculation device model selection screen 61 displayed on the display 60, the user selects a to-be-used-in-calculation device model having a circuit that is the same as or similar to the sample 23 to be measured. In the present embodiment, one to-be-used-in-calculation device model is selected. Specifically, the user checks a check box corresponding to a to-be-used-in-calculation device model to be selected, and then touches the selection determination button 61*e* to finalize the selection of the to-be-used-in-calculation device model. FIG. 6 shows a case where a to-be-used-in-calculation device model assigned the ID "DM1" is selected. The to-be-used-in-calculation device model thus selected is sent to the to-be-used-in-computation netlist generator 32 shown in FIG. 2.

In step S20, the to-be-used-in-computation netlist generator 32 generates a to-be-used-in-computation netlist on the basis of the to-be-used-in-calculation device model selected by the user. For example, the method for generating the to-be-used-in-computation netlist is not limited to a method by which the to-be-used-in-computation netlist generator 32 combines any of the model 42*b*, the parameter type 42*d*, the shape of the device, or the physical properties of the device and the parameter value 42*e* included in the selected to-be-used-in-calculation device model to generate the to-be-used-in-computation netlist.

Figure 7:
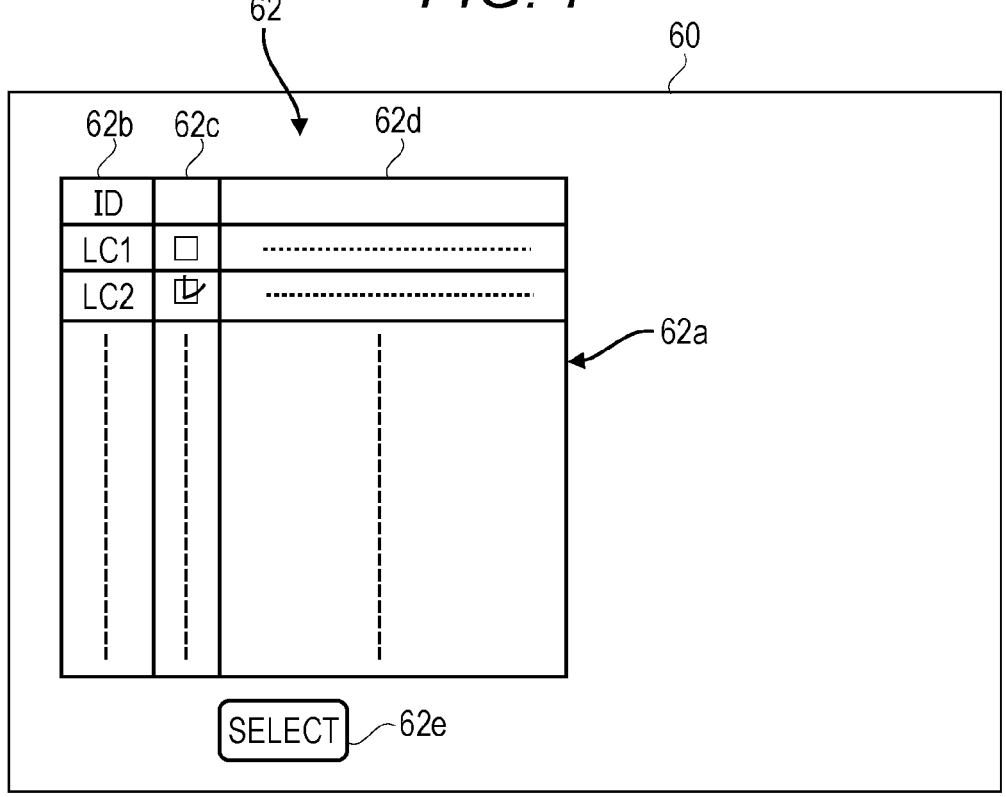
FIG. 7 is a diagram showing an example of an optical condition selection screen.

In step S30, an optical condition is selected. FIG. 7 is a diagram showing an example of an optical condition selection screen. On an optical condition selection screen 62 shown in FIG. 7, for example, a list 62*a* of the optical conditions registered in the database 42 and a selection determination button 62*e* are displayed. The list 62*a* includes an ID display field 62*b* of each of the registered optical condition, an optical condition selection field 62*c*, and a details display field 62*d* of a corresponding optical condition.

The user selects a desired optical condition from the optical condition selection screen 62 displayed on the display 60. More specifically, the user checks a checkbox corresponding an optical condition to be selected, and then touches the selection determination button 62*e* to finalize the selection of the optical condition. FIG. 7 shows a case where an optical condition assigned the ID "LC2" is selected. The optical condition thus selected is stored in the optical condition storage section 43 shown in FIG. 2.

Note that, in step S10, when the selection determination button 61*e* is touched to finalize the selection of the to-be-used-in-calculation device model, the optical condition selection screen 62 may be displayed after the to-be-used-in-calculation device model selection screen 61 is deleted. Further, when the selection of the to-be-used-in-calculation device model is finalized, the optical condition selection screen 62 may be displayed superimposed on the to-be-used-in-calculation device model selection screen 61. The optical condition selection screen 62 may be provided with a button that causes the to-be-used-in-calculation device model selection screen 61 to be displayed again.

Further, for the settings of the optical condition, the electron beam pulse conversion condition (modulation condition) is used as necessary. The electron beam pulse conversion condition may be used together with the optical condition, or the electron beam pulse conversion condition alone may be set as the optical condition.

In step S40, the electron beam is applied to the sample 23 under the optical condition selected in step S30. The optical condition stored in the optical condition storage section 43 is sent to the controller 11 of the charged particle beam apparatus main body 10. The controller 11 controls each component of the charged particle beam optical system BS to apply the electron beam to the sample 23 under the optical condition thus received. When the electron beam is applied to the sample 23, the secondary electrons are emitted from the sample 23. When detecting the secondary electrons emitted from the sample 23, the detector 25 outputs a predetermined detection signal in accordance with the number of the secondary electrons, application energy, or the like to the computer 30 (computing unit 31).

In step S50, an actual electron beam application result of the sample 23 is stored. The computing unit 31 may store, for example, the detection signal (signal waveform) output from the detector 25 in the electron beam application result storage section 45 as the electron beam application result. Further, the computing unit 31 may generate an inspection image (SEM image or the like) on the basis of the detection signal and store the inspection image in the electron beam application result storage section 45 as the electron beam application result. Further, the computing unit 31 may measure an electrical charge carried by the sample 23 on the basis of the detection signal and store the electrical charge thus measured in the electron beam application result storage section 45. Further, the computing unit 31 may detect brightness of the inspection image or brightness of each pixel of the inspection image and store the brightness thus detected in the electron beam application result storage section 45.

In step S60, the to-be-used-in-computation netlist generated in step S20 is stored in the to-be-used-in-computation netlist storage section 44. Note that step S20 and step S60 are separately shown in FIG. 5, but the process of step S60 may be executed in step S20.

In step S70, the electron beam application result is estimated. The electron beam application result estimation computing unit 33 estimates the electron beam application result of the sample 23 on the basis of the to-be-used-in-computation netlist stored in the to-be-used-in-computation netlist storage section 44 and the optical condition stored in the optical condition storage section 43. Items of the electron beam application result to be estimated here are the same as measurement items in step S50, and include, for example, the detection signal (signal waveform) output from the detector 25, the electrical charge, the inspection image, the brightness of the inspection image, the brightness of each pixel of the inspection image, and the like.

In step S80, the electron beam application result estimated in step S70 is stored in the estimated application result storage section 46.

In step S90, the actual electron beam application result and the estimated electron beam application result are compared. The comparator 34 compares the actual electron beam application result and the estimated electron beam application result for each item of the electron beam application result. The comparator 34 compares the detection signals for each electron beam application region or each pixel of the inspection image, for example. The comparator 34 also compares, for example, the electrical charge, the inspection image, the brightness of the inspection image, the brightness of each pixel of the inspection image, and the like. The comparator 34, for example, digitizes these application results and calculates a difference between the actual electron beam application result and the estimated electron beam application result for each item to generate a comparison result. Note that the comparator 34 may compare all of these items, or may compare only some of the items.

In step S100, a determination is made as to whether the actual electron beam application result and the estimated electron beam application result coincide with each other on the basis of the comparison result calculated in step S90. For example, when a value of the comparison result is "0", the comparator 34 determines that these application results coincide with each other. On the other hand, when the value of the comparison result is not "0", the comparator 34 determines that these comparison results differs from each other. Note that, in practice, these application results rarely coincide with each other; therefore, it is necessary to take a measurement error within a predetermined range into account.

This allows the comparator 34 to determine that the application results coincide with each other when the value of the comparison result is equal to or less than a predetermined threshold. The predetermined threshold is defined for each item. Note that when the comparison is made for a plurality of items, the comparator 34 may determine that these application results coincide with each other only when the comparison results for all the items are equal to or less than the respective thresholds, or alternatively, may determine that these application results coincide with each other when the comparison results for at least a predetermined number of items are equal to or less than the respective thresholds.

When the comparator 34 determines in step S100 that these electron beam application results differ from each other (No), the process of step S110 is executed.

In step S110, the to-be-used-in-computation netlist is updated. The comparator 34 sends the comparison result to the to-be-used-in-computation netlist generator 32, and the to-be-used-in-computation netlist generator 32 updates the to-be-used-in-computation netlist, for example. The to-beused-in-computation netlist generator 32 changes, on the basis of the comparison result, a parameter value used in generation of the last to-be-used-in-computation netlist, and generates a to-be-used-in-computation netlist using the parameter value thus changed, for example. As described above, the to-be-used-in-computation netlist generator 32 updates the to-be-used-in-computation netlist. At this time, the to-be-used-in-computation netlist generator 32 may change the parameter value on the basis of the comparison results for a plurality of items. Further, the to-be-used-in-computation netlist generator 32 may preset a parameter whose parameter value is variable and update the to-be-used-in-computation netlist while changing the parameter value of only such a variable parameter.

The updated to-be-used-in-computation netlist is stored in the to-be-used-in-computation netlist storage section 44 (step S60). The electron beam application result is estimated again using the updated to-be-used-in-computation netlist and the optical condition (step S70), and the estimated electron beam application result is stored in the estimated application result storage section 46 (step S80). Then, the electron beam application result estimated using the updated to-be-used-in-computation netlist and the actual electron beam application result are compared again (step S90).

The processes of steps S60 to S110 are repeatedly executed until the estimated electron beam application result and the actual electron beam application result coincide with each other. Note that the to-be-used-in-computation netlist may be updated in the to-be-used-in-computation netlist storage section 44. In this case, the processes of steps S70 to S110 are repeatedly executed until the estimated electron beam application result and the actual electron beam application result coincide with each other.

On the other hand, in step S100, when the comparator 34 determines that these electron beam application results coincide with each other (Yes), the process of step S120 is executed. In step S120, the computing unit 31 (comparator 34) determines that the to-be-used-in-computation netlist stored in the to-be-used-in-computation netlist storage section 44 can be identified as a netlist describing the circuit of the sample 23, and stores this to-be-used-in-computation netlist in the estimated netlist storage section 47 as an estimated netlist. Further, in addition to the estimated netlist, a correspondence table that associates a position of a plug electrode in the inspection image with each node in the estimated netlist may be stored in the estimated netlist storage section 47.

In step S130, the estimation result and measurement result are output to the input and output part 50. For example, the estimated netlist stored in the estimated netlist storage section 47, the estimated electron beam application result stored in the estimated application result storage section 46, the actual electron beam application result stored in the electron beam application result storage section 45 are output to the input and output part 50 and displayed on the display 60.

FIG. 8 is a diagram showing an example of a result display screen after circuit estimation. As shown in FIG. 8, a to-be-used-in-calculation device model designation section 71, an estimated result display section 72, an estimated electron beam application result display section 73, and an electron beam application result display section 74 are each displayed as a result display screen 70.

In the to-be-used-in-calculation device model designation section 71, details of the selected to-be-used-in-calculation device model, the selected optical condition, and the like are displayed. For example, the user can confirm the details of the selected to-be-used-in-calculation device model and optical condition by touching the to-be-used-in-calculation device model designation section 71. In the estimated result display section 72, each parameter value used in generation of the estimated netlist is displayed. Further, in the estimated result display section 72, information on whether the parameter is variable may be displayed together with the parameter value.

In the estimated electron beam application result display section 73, the estimated electron beam application result is displayed. In the estimated electron beam application result display section 73, a graph in which the horizontal axis represents the electron beam application condition (optical condition), and the vertical axis represents the brightness (brightness) is displayed. Specifically, in the estimated electron beam application result display section 73, electron beam application results estimated for a plurality of nodes (plug electrodes) are displayed. Note that, in the estimated electron beam application result display section 73, not only the estimated result using the estimated netlist but also the estimated result using the to-be-used-in-computation netlist before being identified may be displayed.

In the electron beam application result display section 74, the actually measured electron beam application result is displayed. In the electron beam application result display section 74, a graph in which the horizontal axis represents the electron beam application condition and the vertical axis represents the brightness (brightness) is displayed in the same manner. In the electron beam application result display section 74, electron beam application results for a plurality of nodes are displayed.

Note that the graphs displayed in the estimated electron beam application result display section 73 and the electron beam application result display section 74 can be configured as desired. For example, a graph in which the vertical axis represents the amount of detected secondary electrons may be displayed. Further, in each of the estimated electron beam application result display section 73 and the electron beam application result display section 74, the waveform of the detection signal, the inspection image, and the like may be displayed.

Further, the estimated electron beam application result display section 73 and the electron beam application result display section 74 may be combined such that the estimated result and the measured result are displayed together.

Figures 9A, 9B, 9C:
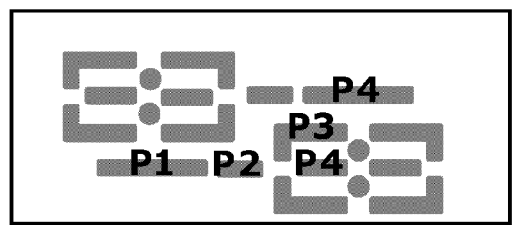
FIGS. 9A to 9C are diagrams showing another example of the result display screen after circuit estimation.

FIGS. 9A to 9C are diagrams showing another example of the result display screen after circuit estimation. In the result display screen 70, not only the sections shown in FIG. 8, but also images shown in FIGS. 9A to 9C may be displayed, for example. FIG. 9A is an image representing an inspection image in which coordinates of plug electrodes are additionally illustrated. FIG. 9B is an estimated netlist. FIG. 9C is a correspondence table that associates each of the positions of the plug electrode in the inspection image with a corresponding node in the estimated netlist. Further, a circuit diagram based on the estimated netlist may be displayed in the result display screen 70.

Note that processes such as the generation of the to-be-used-in-computation netlist, the measurement through application of the electron beam, and the estimation of the electron beam application result have been described in order with reference to FIG. 5, but these processes may be executed in parallel. For example, the measurement through application of the electron beam may be executed at the same time as the generation of the to-be-used-in-computation netlist and the estimation of the electron beam application result.

Further, artificial intelligence (AI) based on a method such as machine learning or deep learning may be applied to processes such as the estimation of the electron beam application result in step S70, the update of the to-be-used-in-computation netlist in step S110, and the like.

<Main Effects of the Present Embodiment>

According to the present embodiment, the to-be-used-in-computation netlist is generated on the basis of the to-be-used-in-calculation device model, and the electron beam application result when the electron beam is applied to the sample is estimated on the basis of the to-be-used-in-computation netlist and the optical condition. Further, the estimated electron beam application result is compared with the electron beam application result when the electron beam is applied to the sample 23 on the basis of the optical condition.

This configuration eliminates the need of converting an external netlist input from the outside into the to-be-used-in-computation netlist, and thereby allows the electrical characteristics of the sample 23 to be estimated in a short time, increasing the throughput. The configuration further allows the electrical characteristics and circuit of the sample 23 to be freely estimated without being affected by the configuration of the external netlist, and thereby allows the electrical characteristics to be estimated with consideration given to interactions between a plurality of devices.

Further, according to the present embodiment, when the estimated electron beam application result and the actual electron beam application result differ from each other, the to-be-used-in-calculation device model is updated. Specifically, the computing unit 31 updates the to-be-used-in-computation netlist by changing the parameter value included in the to-be-used-in-calculation device model and creating the to-be-used-in-computation netlist again using the changed parameter value. This configuration makes it possible to update the to-be-used-in-computation netlist while suppressing the computation amount and to thereby suppress a load on the computing unit 31.

Further, according to the present embodiment, the electron beam application result includes any one of the detection signal, the inspection image based on the detection signal, the brightness of the inspection image, or the brightness of each pixel in the inspection image.

This configuration makes it possible to collate application results with various forms based on the detection signal.

Further, according to the present embodiment, the to-be-used-in-calculation device model includes a model representing a defect in the sample 23. This configuration makes it possible to easily detect a defect (manufacturing defect) in the sample 23 and to thereby increase accuracy in circuit estimation.

Further, according to the present embodiment, the to-be-used-in-calculation device model includes any one of a model defining a circuit of a device, a mathematical expression defining electrical characteristics of the device, a shape of the device, or physical properties of the device. This configuration makes it possible to estimate the circuit of the sample 23 from not only the circuit configuration but also the electrical characteristics, the shape, the physical properties, and the like and to thereby increase accuracy in circuit estimation.

Further, according to the present embodiment, the computing unit 31 generates a correspondence table that associates the position of the plug electrode in the inspection image with each node in the identified to-be-used-in-computation netlist (estimated netlist). This configuration makes the correspondence between the netlist and the inspection image clear.

Further, according to the present embodiment, the electron beam application result is estimated on the basis of the optical condition and the electron beam pulse conversion condition. This configuration makes it possible to increase accuracy in estimation of the electrical characteristics of the sample 23 with the electron beam that changes in a complicated manner.

Second Embodiment

Next, a second embodiment will be described. According to the present embodiment, a plurality of to-be-used-in-calculation device models and one optical condition are used, and application results are compared for each of the to-be-used-in-calculation device models. An apparatus structure according to the present embodiment is the same as the structure shown in FIGS. 1 to 4.

<Circuit Estimation Method for Sample>

Next, a circuit estimation method according to the present embodiment will be described. According to the present embodiment, the circuit estimation is also performed according to the flow shown in FIG. 5. The following mainly describes processes different from the processes according to the first embodiment.

In step S10, a plurality of to-be-used-in-calculation device models are selected. For example, the user selects the plurality of to-be-used-in-calculation device models by checking the check boxes of the plurality of to-be-used-in-calculation device models on the to-be-used-in-calculation device model selection screen 61 shown in FIG. 6 and touching the selection determination button 61e.

In step S20, the to-be-used-in-computation netlist for each of the selected plurality of to-be-used-in-calculation device models is generated. Then, in step S60, the to-be-used-in-computation netlists generated in step S20 are stored in the to-be-used-in-computation netlist generator 32.

In step S70, the electron beam application result is estimated using each of the to-be-used-in-computation netlists stored in the to-be-used-in-computation netlist generator 32. In step S80, a plurality of electron beam application results estimated in step S70 are stored in the estimated application result storage section 46.

In step S90, the actual electron beam application result and the estimated plurality of electron beam application results are compared. The comparator 34 generates a comparison result for each of the estimated electron beam application results. In step S100, a determination is made as to whether the actual electron beam application result and each of the estimated electron beam application results coincide with each other.

When a determination is made in step S100 that the actual electron beam application result coincides with none of the estimated electron beam application results (No), all the to-be-used-in-computation netlists are updated in step S110. On the other hand, when a determination is made that the actual electron beam application result coincides with any one of the estimated electron beam application results (Yes), the process of step S120 is executed.

In step S120, the to-be-used-in-computation netlist corresponding to the estimated electron beam application result that coincides with the actual electron beam application result is identified as a netlist describing the sample 23. The identified to-be-used-in-computation netlist is stored in the estimated netlist storage section 47 as an estimated netlist.

In step S130, the estimation results for the plurality of to-be-used-in-calculation device models may be displayed on the result display screen 70.

<Main Effects of the Present Embodiment>

According to the present embodiment, the following effects can be obtained in addition to the effects of the above-described embodiment. According to the present embodiment, a plurality of to-be-used-in-calculation device models and one optical condition are used, and, for each of the to-be-used-in-calculation device models, the estimated electron beam application result and the actual electron beam application result are compared. This configuration makes it possible to estimate, in a short time, the circuit and electrical characteristics of the sample 23 having a complicated structure.

Third Embodiment

Next, a third embodiment will be described. According to the present embodiment, one to-be-used-in-calculation device model and a plurality of optical conditions are used, and application results are compared for each of the optical conditions. An apparatus structure according to the present embodiment is also the same as the structure shown in FIGS. 1 to 4.

<Circuit Estimation Method for Sample>

Next, a circuit estimation method according to the present embodiment will be described. According to the present embodiment, the circuit estimation is also performed according to the flow shown in FIG. 5. The following mainly describes processes different from the processes according to the first embodiment.

In step S30, a plurality of optical conditions are selected. For example, the user selects the plurality of optical conditions by checking the check boxes of the plurality of optical conditions on the optical condition selection screen 62 shown in FIG. 7 and touching the selection determination button 62e.

In step S40, the electron beam is applied to the sample 23 sequentially under the plurality of optical conditions thus selected. In step S50, the actual electron beam application result of the sample 23 is stored in the electron beam application result storage section 45 for each of the optical conditions.

In step S90, the actual electron beam application result and the estimated electron beam application result are compared for each of the optical conditions. The comparator 34 generates a comparison result for each of the optical conditions. In step S100, a determination is made as to whether each of the electron beam application results and a corresponding one of the estimated electron beam application results coincide with each other.

When a determination is made in step S100 that none of the plurality of electron beam application results coincides with the estimated electron beam application results (No), the to-be-used-in-computation netlists are updated in step S110. On the other hand, when a determination is made that any one of the electron beam application results coincides with a corresponding one of the estimated electron beam application results (Yes), the process of step S120 is executed.

In step S120, the to-be-used-in-computation netlist stored in the to-be-used-in-computation netlist storage section 44 is stored in the estimated netlist storage section 47 as an estimated netlist. At this time, the optical condition when the actual electron beam application result and the estimated electron beam application result coincide with each other may be stored together.

In step S130, measurement results for the plurality of optical conditions may be displayed on the result display screen 70.

<Main Effects of the Present Embodiment>

According to the present embodiment, with one to-be-used-in-calculation device model and a plurality of optical conditions, the estimated electron beam application result and the actual electron beam application result are compared for each of the optical conditions. This configuration makes it is possible to increase accuracy in estimation of the electrical characteristics.

[Modification]

Note that the present embodiment is also applicable to a case where a comparison is made on the basis of the estimated netlist identified in the first embodiment and a plurality of optical conditions. In this case, steps such as the selection of the to-be-used-in-calculation device model, the generation/update of the to-be-used-in-computation netlist, and the identification of the to-be-used-in-computation netlist can be omitted as appropriate.

This facilitates the estimation of the electrical characteristics of the sample whose netlist has been identified, and makes it possible to increase accuracy in estimation.

Note that the present invention is not limited to the above-described embodiments and includes various modifications. Further, some of the components of one embodiment can be replaced with corresponding components of another embodiment, and a component of another embodiment can be added to the components of one embodiment. Further, it is possible to add different components to the components of each embodiment, delete some of the components of each embodiment, and replace some of the components of each embodiment with different components. Note that each member and relative size shown in the drawings have been simplified and idealized for easy understanding of the present invention, and the present invention may have a more complicated shape when being implemented.

What is claimed is:

1. A charged particle beam apparatus comprising:
    a database configured to store a to-be-used-in-calculation device model for use in estimation of a circuit of a sample and an optical condition under which a charged particle beam is applied to the sample;
    a charged particle beam optical system comprising a lens barrel mounted on a sample chamber and operatively coupled with a controller configured to control the charged particle beam applied to the sample under the optical condition;
    a detector configured to detect secondary electrons emitted from the sample excited by the application of the charged particle beam and output a detection signal based on the secondary electrons; and
    a computer configured to generate a to-be-used-in-computation netlist on a basis of the to-be-used-in-calculation device model, estimate a first application result when the charged particle beam is applied to the sample on a basis of the to-be-used-in-computation netlist and the optical condition, and compare the first application result with a second application result when the charged particle beam is applied to the sample on a basis of the optical condition.

2. The charged particle beam apparatus according to claim 1, wherein the computer is further configured to update the to-be-used-in-calculation device model when the first application result and the second application result differs from each other, and identify the to-be-used-in-computation netlist as a netlist describing the circuit of the sample when the first application result and the second application result coincide with each other.

3. The charged particle beam apparatus according to claim 2, wherein the computer is further configured to change a parameter value included in the to-be-used-in-calculation device model, and update the to-be-used-in-computation netlist using the parameter value changed.

4. The charged particle beam apparatus according to claim 1, wherein the second application result includes any one of the detection signal, an inspection image based on the detection signal, brightness of the inspection image, or brightness of each pixel of the inspection image.

5. The charged particle beam apparatus according to claim 1, wherein the to-be-used-in-calculation device model includes a model representing a defect in a device.

6. The charged particle beam apparatus according to claim 1, wherein the to-be-used-in-calculation device model includes any one of a model defining a circuit of a device, a mathematical expression defining electrical characteristics of the device, a shape of the device, or physical properties of the device.

7. The charged particle beam apparatus according to claim 6, wherein the to-be-used-in-calculation device model includes a parameter value of a circuit element included in the circuit of the device.

8. The charged particle beam apparatus according to claim 2, wherein the computer is further configured to generate an inspection image on a basis of the detection signal, and generate a correspondence table that associates a position of a plug electrode in the inspection image with each node in the to-be-used-in-computation netlist identified.

9. The charged particle beam apparatus according to claim 1, wherein
the database stores a pulse conversion condition under which the charged particle beam is pulsed,
the charged particle beam optical system controls the charged particle beam applied to the sample under the optical condition and the pulse conversion condition, and
the computer estimates the first application result on a basis of the optical condition and the pulse conversion condition.

10. The charged particle beam apparatus according to claim 1, wherein the computer is further configured to compare, using a plurality of the to-be-used-in-calculation device models, and one of the optical conditions, the first application result and the second application result for each of the to-be-used-in-calculation device models.

11. The charged particle beam apparatus according to claim 1, wherein the computer is further configured to compare, using one of the to-be-used-in-calculation device models, and a plurality of the optical conditions, the first application result and the second application result for each of the optical conditions.

* * * * *